(12) United States Patent
Livni et al.

(10) Patent No.: US 6,317,618 B1
(45) Date of Patent: Nov. 13, 2001

(54) TRANSPORTABLE INTRAOPERATIVE MAGNETIC RESONANCE IMAGING APPARATUS

(75) Inventors: Avinoam Livni, Haifa; Ehud Katznelson, Ramat-Yishai; Yuval Zuk, Haifa, all of (IL)

(73) Assignee: Odin Technologies Ltd., Yokneam Elit (IL)

( * ) Notice: Subject to any disclaimer, the term of this patent is extended or adjusted under 35 U.S.C. 154(b) by 0 days.

(21) Appl. No.: 09/324,218

(22) Filed: Jun. 2, 1999

(51) Int. Cl.$^7$ .................................................. A61B 5/055
(52) U.S. Cl. .................. 600/410; 600/415; 600/421; 600/422; 324/318
(58) Field of Search .................................. 600/410, 415, 600/421, 422; 324/307, 309, 318, 322

(56) References Cited

U.S. PATENT DOCUMENTS 5,072,732 * 12/1991 Rapoport et al. ..................... 600/421
6,029,081 * 2/2000 DeMeester et al. .................. 600/410

* cited by examiner

*Primary Examiner*—Ruth S. Smith
(74) *Attorney, Agent, or Firm*—Pennie & Edmonds LLP (57) ABSTRACT

A transportable magnetic resonance imaging apparatus, said apparatus comprising a transportable platform, provided with a casing made of ferromagnetic metal, and a magnetic resonance imaging system mounted onto said transportable platform, said magnetic resonance imaging system comprising a front end and a back end, the front end comprising a magnetic structure for the provision of a magnetic field, at least two gradient coils, RF transmit coil, and RF receive coil, and the back end comprising a host computer as a central processing unit, at least two gradient amplifiers, RF amplifier, MRI spectrometer, MRI controller and display unit, wherein said apparatus is provided with a positioning assembly for moving and positioning said magnetic structure between a first position and a second position, said first position being such that a patient's body part is positioned between said magnetic field, and said second position being such that said pair of magnets is positioned inside said casing, when not in use, in order to suppress the magnetic flux of said pair of magnets outside said casing.

30 Claims, 5 Drawing Sheets

TRANSPORTABLE INTRAOPERATIVE MAGNETIC RESONANCE IMAGING APPARATUS

FIELD OF THE INVENTION

The present invention relates to magnetic resonance imaging (MRI). More particularly it relates to a transportable MRI apparatus, particularly suitable for intraoperative use.

BACKGROUND OF THE INVENTION

MRI (Magnetic Resonance Imaging) and IMRI (Intraoperative Magnetic Resonance imaging) are well known diagnostic (MRI) and therapeutic (IMRI) tools in medicine. The remarkable soft tissue contrast resolution associated with these techniques is invaluable and renders these techniques high appreciation among the medical community.

Basically, the MRI technique is exploiting nuclear magnetism induced on the patient's tissues (a very clear explanation of the MRI principles is provided by Joseph P. Hornak, of the Rochester Institute of Technology, on the World Wide Web, http://www.cis.rit.edu/htbooks/mri/mri-main.htm, and see also U.S. Pat. No. 5,304,933). It is based on the fact that atoms with an odd number of protons or neutrons possess a weak but noticeable magnetic moment. Normally these magnetic moments are randomly oriented, but when subjected to a strong magnetic field (usually referred to as $B_0$), they are forced to align. The static nuclear moment (spin) of the aligned nucleons under the strong magnetic field is too weak to be detected. Therefore, the aligned nucleon moments are tipped away from the z direction of the static strong magnetic field, using a weak rotating radio frequency (RF). The resonance frequency of a nucleon is called the Larmor Frequency. When perpendicular to the static field, the moment experiences torque proportional to the static magnetic field, which causes the spins to oscillate or precess in a plane perpendicular to the static field. As the precessing spins constitute a time varying flux, they produce a measurable current picked up in a loop antenna, arranged to receive the x and/or y and/or z components of the induced signal.

In order to distinguish between spins of identical atoms in different regions each of the regions of spin has to experience a unique magnetic field. Therefore a gradient in the magnetic field in applied, in the x, y (and even z direction, if a three dimensional image is to be constructed). The oscillating moments in the object to be imaged comprise an array of oscillators, which due to the gradient in the magnetic field have distinctive oscillation phase with respect to their spatial location.

The spins are subjected to a pulse of known properties which deflects the spins away from their magnetized orientation, and as they return to their original magnetized orientation they transmit a signal in the radio frequency which can be picked up and sampled by the antenna. The process is repeated n×m times, to produce an image with an n×m (or n×m×l, for a three-dimensional image, n, m and l being an integer) voxel resolution. The image is constructed using a known procedure involving the application of spatial Fourier Transforms performed on the signal received by the antenna, to produce a matrix of values representing gray-scale levels representation of the voxels.

MRI systems for performing whole body imaging employ large magnets that effectively surround the patient. These magnets are usually large superconductor magnets, taking up a large space (sometimes a room), are expensive and require high operating and maintenance costs. The large size of these magnets prevents any access to the patient.

However recently MRI systems for performing local imaging of specific body parts or organs were introduced. The basic concept of such systems is the realization that the soaring costs of whole-body imaging systems could be greatly reduced if smaller systems are constructed, taking also in consideration the fact that in most cases only a part of an organ of the patient's body needs imaging.

Israel Pat. Appl. No. 119558 (Katznelson et al.) filed Nov. 4, 1996, discloses a compact, transportable, intra-operative MRI System, which include a host computer coupled to a central electronics system which may be coupled to different MRI probes.

Compact MRI systems for performing local imaging of specific body parts or organs may use a hollow tube-like magnet assembly or other assemblies, such as two opposing magnets, such as described in U.S. Pat. No. 5,900,793 (Katznelson et al.), filed Jul. 23, 1997.

U.S. Pat. No. 5,735,278 (Hoult et al.), filed Mar. 15, 1996, disclosed an apparatus for use in surgical procedure comprising an operating table for receiving a patient for surgery and an MRI system for obtaining images of a part of the patient as a series of time through the surgical procedure for analysis by the surgical team to allow monitoring the progress of the surgery. The high field magnet and the operating table are shaped and arranged for positioning of the part of the patient into the magnetic field while the patient remains in place of the table and the magnet is mounted for movement between a first position spaced from the table and the patient thereon to allow the surgical team to carry out the surgical procedure and a second position for applying the magnetic field to the part of the patient. The table remains substantially stationary and only the magnet is moved to a position spaced from an adjacent end of the table to allow the surgical team to move around the adjacent end of table and to each side of the table to access the patient.

Usually an intraoperative MRI system (IMRI), such as the ones discussed above, would comprise an MRI system, with a magnet, positioned over an operating table. The magnet assembly is constructed so as to leave open spaces around the patient allowing the medical team to attend the patient. Another solution was the introduction of a magnet probe that can be brought near the patient lying on the operating table to perform the imaging, and then retracted to clear the way for the medical staff to access the patient. In Israeli Pat. Appl No. 119558 (Katznelson et al.) mentioned above, a transportable MRI system was introduced, that was intended to allow moving of the whole system within the operating room.

The cost of MRI systems—certainly the whole body imaging devices, but also smaller types of MRI systems—imposes a heavy toll on any hospital or other medical institute budget. Usually these medical institutions, which possess an MRI system, have only one such system, occupying a large spaced room, and serving as a designated imaging unit, with patients from various wards being sent to that unit to be imaged. Other institutions even prefer to cope without any MRI system, and rely on other institutions that have MRI systems to provide them MRI services.

BRIEF DESCRIPTION OF THE INVENTION

It is the object of the present Invention to provide an intraoperative magnetic resonance imaging apparatus that is transportable and allows the easy transfer of the system in the operating room and outside, facilitating the transferring of said transportable MRI apparatus from one ward or department to another within the perimeters of a medical institute, or even outdoor.

As the conveying of superconducting magnets is virtually impractical, this leaves the option of using a permanent magnet, or a resistive magnet (however resistive magnets are somewhat less desirable as they need very strong currents to produce the strong magnetic field required). The problem with permanent magnets possessing strong magnetic fields is that the magnetic field they produce strongly affects their surroundings. If a relatively large permanent magnet producing a strong magnetic field (In the order of 0.1 to 0.6 Tesla) is wheeled down a crowded hospital corridor it is likely to cause, in its immediate surroundings, undesirable magnetic disorders such as malfunction of electric and electronic equipment, may influence pacemaker performance, and may possibly damage magnetic data storing devices (such as credit cards etc.)

It is therefore a further object of the present invention to provide a transportable intraoperative magnetic resonance imaging apparatus provided with a removable magnetic flux suppressor to suppress the magnetic flux of the magnet in its surroundings while the apparatus is being transferred.

It is therefore thus provided, in accordance with a preferred embodiment of the present invention, a transportable magnetic resonance imaging apparatus, said apparatus comprising a transportable platform, provided with a casing made of ferromagnetic metal, and a magnetic resonance imaging system mounted onto said transportable platform, said magnetic resonance system comprising a front end and a back end, the front end comprising a magnetic structure for the provision of a magnetic field, at least two gradient coils, RF transmit coil and RF receive coil, and the back end comprising a host computer it being the central processing unit, at least two gradient amplifiers, RF amplifier, MRI spectrometer, MRI controller and display unit, wherein said apparatus is provided with positioning means for moving and positioning said magnetic structure between a first position and a second position, said first position being such that a patient's body part is positioned within said magnetic field, and said second position being such that said pair of magnets is positioned inside said casing, when not in use, in order to suppress the magnetic flux of said pair of magnets outside said casing.

Furthermore, in accordance with a preferred embodiment of the present invention said magnetic structure comprises a pair of permanent magnets.

Furthermore, in accordance with a preferred embodiment of the present invention, said platform is provided with wheels.

Furthermore, in accordance with a preferred embodiment of the present invention said pair of magnets are spaced apart as to allow the insertion of a body part of organ into the space within the pair of permanent magnet.

Furthermore, in accordance with a preferred embodiment of the present invention, said pair of permanent magnets is joined together by a U-shaped frame whose one arm is coupled to one of said pair of magnets, and whose other arm is coupled to the other of said pair of magnets.

Furthermore, in accordance with a preferred embodiment of the present invention, said unshaped frame is provided with a shaft pivotally connected to an arm provided on said platform.

Furthermore, in accordance with a preferred embodiment of the present invention, said arm is inverted-L-shaped, and is pivotally coupled to a slider block which can slidably move and be repositioned along a vertical column mounted on said platform.

Furthermore, in accordance with a preferred embodiment of the present invention, said arm may swivel pivotally about said column.

Furthermore, in accordance with a preferred embodiment of the present invention, adjacent each one of said pair of magnets, at the outer distal side or inner proximal side of each magnet, a gradient coil is positioned.

Furthermore, in accordance with a preferred embodiment of the present invention, said platform is provided with housing constructed from ferromagnetic material into which said magnetic resonance imaging components, apart from said pair of magnets and gradient coils, are positioned.

Furthermore, in accordance with a preferred embodiment of the present invention, said command input means and display means may be extracted from said housing or retracted into it.

Furthermore, in accordance with a preferred embodiment of the present invention, said wheels are provided with automotive force by a motor.

Furthermore, in accordance with a preferred embodiment of the present invention, said motor is an electric pneumatic or hydraulic motor.

Furthermore, in accordance with a preferred embodiment of the present invention, said ferromagnetic housing is provided with a door, pivotally turnable about a hinge allowing said door to be swung open or be closed.

Furthermore, in accordance with a preferred embodiment of the present invention, said apparatus is provided with RF shielding.

Furthermore, in accordance with a preferred embodiment of the present invention, said RF shielding has fitter interface which filters undesired signals from the front end from interfering with the performance of the back end.

Furthermore, in accordance with a preferred embodiment of the present invention, said RF shielding comprise a portable deployable RF cage.

Furthermore, in accordance with a preferred embodiment of the present invention, said portable deployable RF cage comprises a rigid construction frame, preferably made of stainless steel, provided with wheels, and having two opposing side walls, and two opposite foldable deployable walls, a front wall and a back wall, and a top foldable deployable wall, wherein said walls comprise a copper mesh mounted over said rigid construction frame.

Furthermore, in accordance with a preferred embodiment of the present invention, In order to prevent outside stray signals from infiltrating said RF cage at the seams, RFI gasket is provided along the joining lines of the cage and the apparatus.

Finally, in accordance with a preferred embodiment of the present invention, In order to prevent RF signal from entering said RF cage from underneath, a hard aluminum sheet is placed underneath said cage, prior to the deployment of the cage and throughout the imaging procedure.

BRIEF DESCRIPTION OF THE FIGURES

In order to better understand the present invention, and appreciate its practical applications, the following Figures are provided and referenced hereafter. It should be noted that the Figures are given as examples only and in no way limit the scope of the invention as defined in the appending claims. Like components are denoted by like reference numerals.

DETAILED DESCRIPTION OF THE INVENTION AND FIGURES

Figure 1:
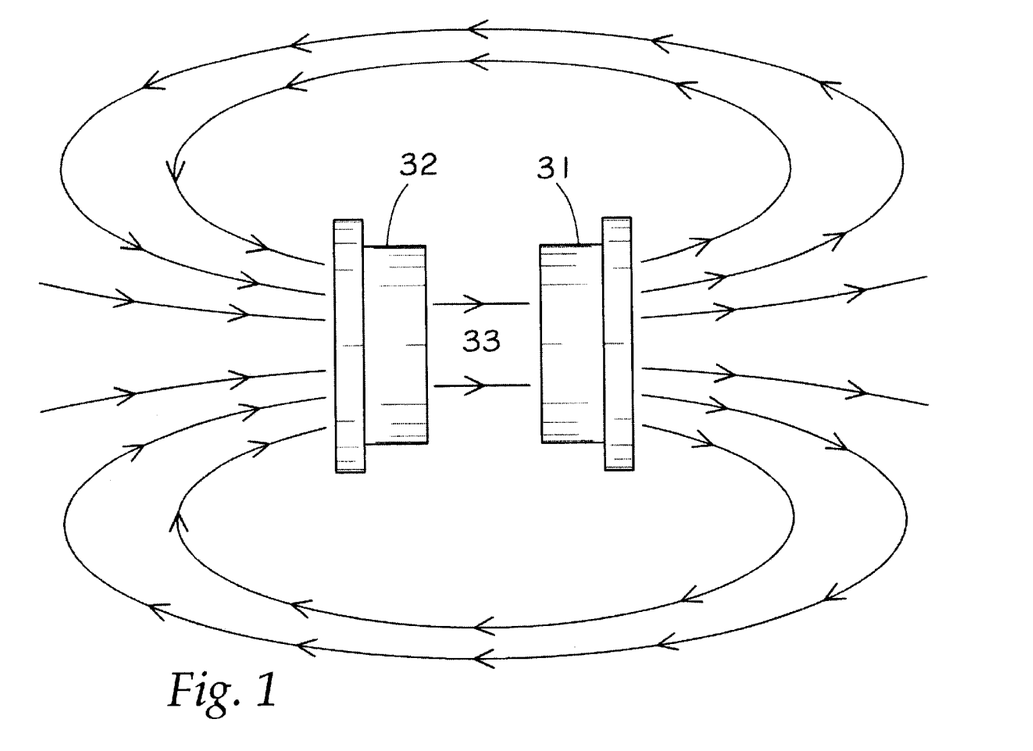
FIG. 1 illustrates a schematic presentation of the magnetic flux around a pair of magnets, in a configuration similar to the configuration of the magnets in the present invention.

FIG. 1 (prior art) illustrates a schematic presentation of the magnetic flux around a pair of magnets, in a configuration common in MRI systems, and similar to the configuration of the magnets in the present invention. In the case of a pair of magnets 31, 32, aligned parallely, the magnetic flux in the volume 33 within the magnets is parallel and directed from the north pole of magnet 32 to the south pole of magnet 31. However around the pair of magnets 31, 32, the magnetic flux lines follow an elipsoid-like path originating from magnet 31 north pole, engulfing the magnets to return to magnet 32 south pole. It is noted that even though for MRI purposes only the magnetic field existing within the magnets is of importance, there exist a substantial magnetic field around the magnets, influencing its near by surroundings. For a pair of magnets, whose dimensions are: R(magnet radius)=20 cm, Gap (between magnets)=25 cm, $B_0$=0.12 Tesla, there exist a noticeable magnetic field extending 1–2 meters away from the magnets.

Figure 2:
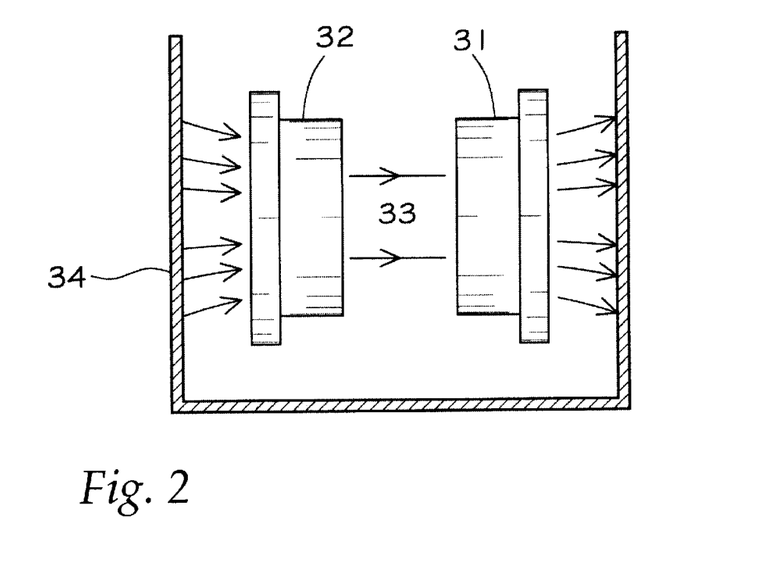
FIG. 2 illustrates the effect of confining a pair of magnets in a ferromagnetic cage, on the magnetic flux of the magnets.

FIG. 2 (prior art) illustrates the effect of confining a pair of magnets (31,32) placed within a ferromagnetic casing 34, on the magnetic flux of the magnets. In order to suppress the magnetic flux in the magnets' surroundings, the magnets are positioned within a cage made of ferromagnetic metal, such as iron or mild steel. The flux lines within the casing are intercepted by the casing walls. The ferromagnetic metal is characterized as having a plurality of magnetic dipoles which are aligned in response to the presence of the magnets within the casing, and cause the magnetic flux lines to end on the walls of the ferromagnetic casing, substantially confining the magnetic field within the casing.

Any MRI system basically consists of a front end and a back end, the front end comprising a magnet, gradient coils, RF transmit coil and RF receive coil. The back end comprises a host computer (the central processing unit), gradient amplifiers (at least two, but usually three), RF amplifier, MRI spectrometer, MRI controller and display unit.

A transportable intraoperative magnetic resonance imaging apparatus, in accordance with a preferred embodiment of the present invention, is mounted on a transportable platform, which can be wheeled and pushed or towed around, and thus brought to the desired location.

The large size of superconducting magnets, and the associated large masses, attributed to the massive construction involved, render superconductor magnets impractical for portable MRI systems. It is therefore an aspect of the present invention to employ permanent magnets, which are more compact in size, lighter and therefore convenient to transfer.

Permanent magnets, such as those used in MRI systems, generating strong magnetic fields (typically in the range of 0.1–0.6 Tesla) induce a large magnetic flux about them, which is substantially present over a large area around the magnet. This flux may prove hazardous to pacemakers, and other delicate electronic equipment operating in the surroundings of the magnets, and therefore in order to facilitate safe transportation of such an MRI system this magnetic flux needs to be eliminated or at least greatly subdued.

It is therefore another aspect of the present invention to provide a ferromagnetic housing into which the magnets are placed when the transportable intraoperative magnetic resonance imaging apparatus of the present invention is transported to or from the location where it is used. In doing so the magnetic flux of the magnets is restrained by the ferromagnetic cage and virtually no magnetic flux exists outside the cage.

The transportable intraoperative magnetic resonance imaging apparatus of the present invention is primarily designed for intraoperative use, but is not limited solely for that use. Its mobility is appealing for any medical institution wishing to have a magnetic resonance imaging facility for diagnostic purposes, and facilitates the transferring of the MRI apparatus safely and conveniently within its perimeters to allow its use in different wards and departments.

A transportable magnetic resonance imaging apparatus, in accordance with a preferred embodiment of the present invention comprises a transportable platform, provided with a casing made of ferromagnetic metal, and a magnetic resonance imaging system mounted onto said transportable platform, said magnetic resonance system comprising a front end and a back end, the front end comprising a magnetic structure for the provision of a magnetic field, at least two gradient coils, RF transmit coil and RF receive coil, and the back end comprising a host computer it being the central processing unit, at least two gradient amplifiers, RF amplifier, MRI spectrometer, MRI controller and display unit, wherein said apparatus is provided with positioning means for moving and positioning said magnetic structure between a first position and a second position, said first position being such that a patient's body part is positioned within said magnetic field, and said second position being such that said pair of magnets is positioned inside said casing, when not in use, in order to suppress the magnetic flux of said pair of magnets outside said casing.

Figure 3:
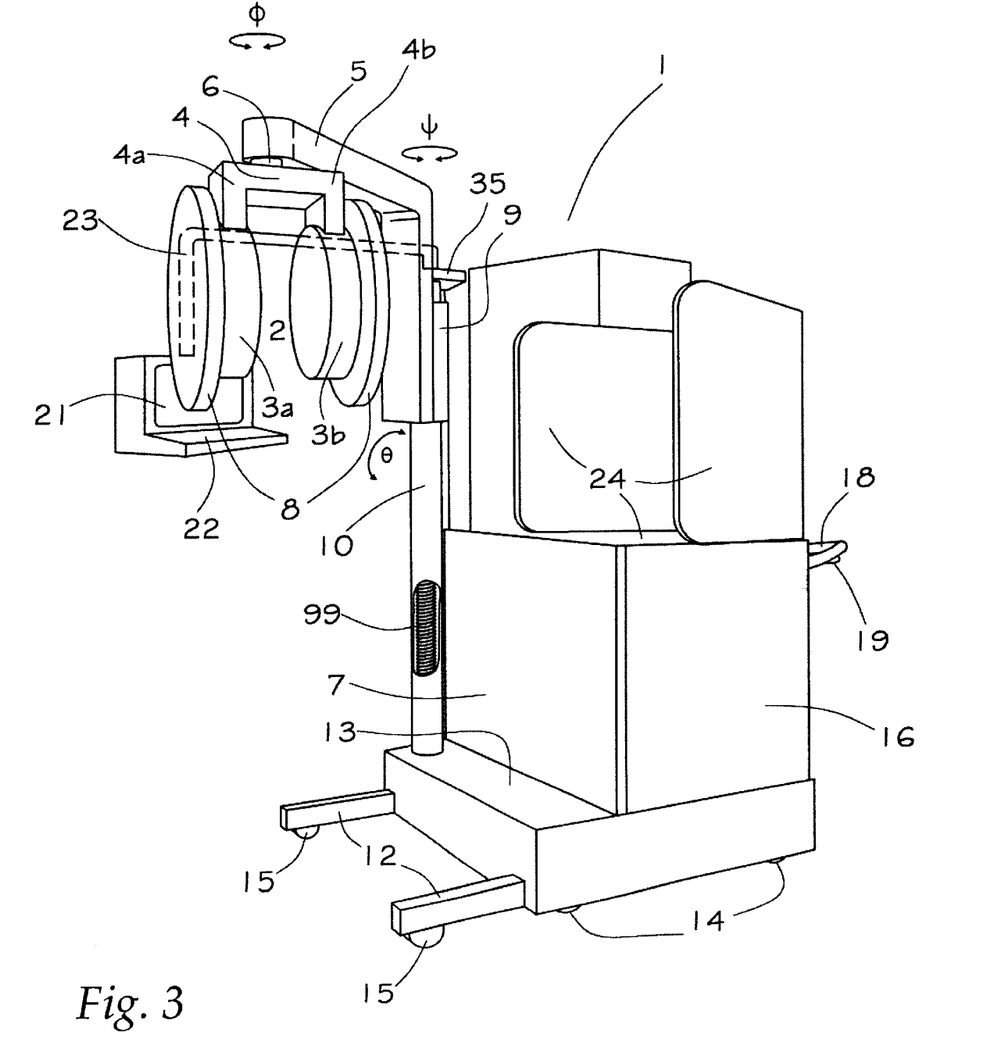
FIG. 3 illustrates a general isometric view of a transportable intraoperative magnetic resonance imaging apparatus, in accordance with a preferred embodiment of the present invention in its operative imaging position.

FIG. 3 illustrates a general isometric view of a transportable intraoperative magnetic resonance imaging apparatus, in accordance with a preferred embodiment of the present invention in its operative imaging position. Said apparatus is generally marked by numeral 1. A pair of permanent magnet assemblies 3A and 3B, whose preferred dimensions are: magnet radius of about 20 cm, width of about 10 cm (perpendicularly to the annular surface), are spaced apart as to allow the insert of a body part or organ into the space 2 within the pair of permanent magnet assemblies 3A and 3B, preferably about 25 cm apart. Neither the magnet assemblies, nor the electronic component of the MRI system, are the subject matter of the present invention and will therefore not be described in detail. The pair of permanent magnet assemblies can be constructed in a manner as described in U.S. Pat. No. 5,900,793, titled "Permanent Magnet Assemblies for use in Medical Applications" (Katznelson et al.), filed Jul. 23, 1997. The pair of permanent magnet assemblies is joined together by a U-shaped frame 4, whose one arm 4A is coupled to one magnet assembly 3A of the pair, and whose other arm 4B is coupled to the other magnet assembly 3B. Adjacent each magnet assembly, at the outer distal side of each magnet (or optionally at the inner proximal side of each magnet), a gradient coil 8 is positioned. The U-shaped frame 4 is provided with a shaft 6 pivotally connected to an arm 5, to allow the frame 4 to swivel about the shaft axis.

The arm 5 is inverted-L-shaped, and Is pivotally coupled to a slider block 9 which can be moved and repositioned along a vertical column 10 mounted on a step 13, at the front of the apparatus main housing 7, and supported from its top by cantilever 35. This way the magnets can be raised and reach substantially the height of the housing 7 top. The deploying and positioning of the magnets is achieved by the following means: lowering or raising of the magnets is achieved by moving slider block 9 up or down vertical column 10, thus raising or lowering arm 5 holding the magnets 3. This is optionally achieved by means of a lead screw 99 extending internally within column 10, provided with external threading (see FIGS. 3, 4), which when rotated raises or lower a nut with corresponding internal threading (not shown in the figures), which is connected to slider block 9 and moves it accordingly. The rotation of lead screw 99 may optionally be acquired by means of a motor positioned within column 10. Arm 5, coupled to block 9, may also swivel pivotally about column 10. The swiveling of block 9, and with it arm 5 may be achieved by means of a motor positioned within housing 7. Furthermore arm 5 can be tilted forward about an angle θ about a horizontal axis at the bottom of slider block 9 (not shown in the figure), optionally by means of a worm wheel and a worm screw which, depending on the direction of rotation, tilt arm 5 forward or backwards. Each of the described motions may be acquired manually or mechanically by means of a motor. It is noted that while the design of the moving and positioning means of the magnets are constructed in the manner described above it is possible to construct different moving and positioning means that would render the magnets the desired maneuverability needed for the magnets to be deployed, and still stay within the scope of the invention, as defined by the appending claims. It is important to provide the magnets with spatial maneuverability in order to allow the positioning of the magnets correctly over the patient's body part or organ that needs imaging, placing it within the magnets. The patient may be lying on an operating table with his organ or body part to be imaged presented so that the magnets 3 may be properly deployed. The positioning of the magnets may be achieved and altered by employing one or more of the three positioning possibilities described above in order to position magnets 3 in the desired elevation over the patient.

Housing 7 is designed to provide the magnets 3 a storage place when not in use or when the apparatus is being transferred. It also houses the electronic MRI components. The apparatus of the present invention can be described in terms of a front end and a back end, the front end comprising a magnet, gradient coils, RF transmit coil and RF receive coil. The back end comprises a host computer (the central processing unit), gradient amplifiers (at least two, but usually three), RF amplifier, MRI spectrometer, MRI controller and display unit.

The display means for the displaying of the image obtained, as well as the input means, should be accessible to the staff operating the apparatus during operation the display means—here a monitor 21—and the input means—keyboard 22—they are optionally suspended from a telescopically extricable pole 23 rotatable about the axis of column 10, that can be drawn closer to the operator of the apparatus, and away, when not in use. The monitor is preferably an LCD display monitor, which is not substantially affected by a near by strong magnetic field.

The electronic components of the apparatus are preferably placed inside housing 7, in the space denoted by numeral 16, beneath the space 20 designated for the storage of the magnets when not in use. Housing 7 has to be constructed from ferromagnetic material in order to prevent magnetic interference with the electric components of the system.

The apparatus is preferably powered by the mains power supply to which the electric circuitry of the apparatus is connected, by means of an electricity cable (not shown in the drawings).

The housing 7 is provided with wheels 14, preferably four wheels, positioned at the bottom of the housing. The wheels may optionally be connected to a motor—possibly an electric pneumatic or hydraulic, to provide an automotive force for the transporting of the apparatus. Transmission gearing means may also be provided, coupled to said motor.

In order to prevent the turning over of the apparatus as a result of the weight of the magnets suspended from the arm outside the housing, the platform is further provided at its bottom with a pair of extricable bars 12 with a wheel 15 at the distal portion of each bar, that can be extracted outside the housing bottom, perpendicularly to the housing, parallel to arm 5, to provide additional support.

The housing 7 is further provided with a handle 18 to allow a person to hold to that handle and steer the apparatus when it Is being transported.

The pair of magnets 3, carried by frame 4 is pivotally connected, by shaft 6 to arm 5, and is rotatable about shaft 6 axis, about angle Φ, preferably about 180°. Arm 5 it self, jointly with block 9, is pivotally connected to column 10, rotatable about an angle Ψ, to allow the magnets to be swivel from imaging position, with the magnets away from the housing, allowing the patient's body part to be imaged to be positioned within the magnets, and storing position inside housing 7. Each of the described motions may be acquired manually or mechanically by means of a motor. Note that column 10 is positioned away from the center of step 13 to allow room for the swiveling of the arm so that magnets 3 may be conveniently put away inside casing 24 or deployed in the imaging position. In order to suppress magnetic flux around the housing when magnets 3 are stored inside, the housing 7 is further provided with a casing 24, made of a ferromagnetic metal, which substantially suppresses the magnets 3 magnetic flux outside said casing. Note also that while in the imaging position, with magnets 3 outside housing 7, both extractable bars 12 are fully extended to provide the support needed for the apparatus and to prevent toppling of it caused by the shift of the center of mass as magnets 3 are brought to the imaging position. Handle 18 is provided with activating levers 19 connected by cables to motorized drive provided which operates wheels 14 (cables and motor drive not shown in the drawings). This is to allow the navigator of the apparatus, when it is transported, to maneuver and brake the apparatus when wheeled around. Optionally the drive is a differential drive, in order to enhance the maneuverability of the apparatus.

Figure 4:
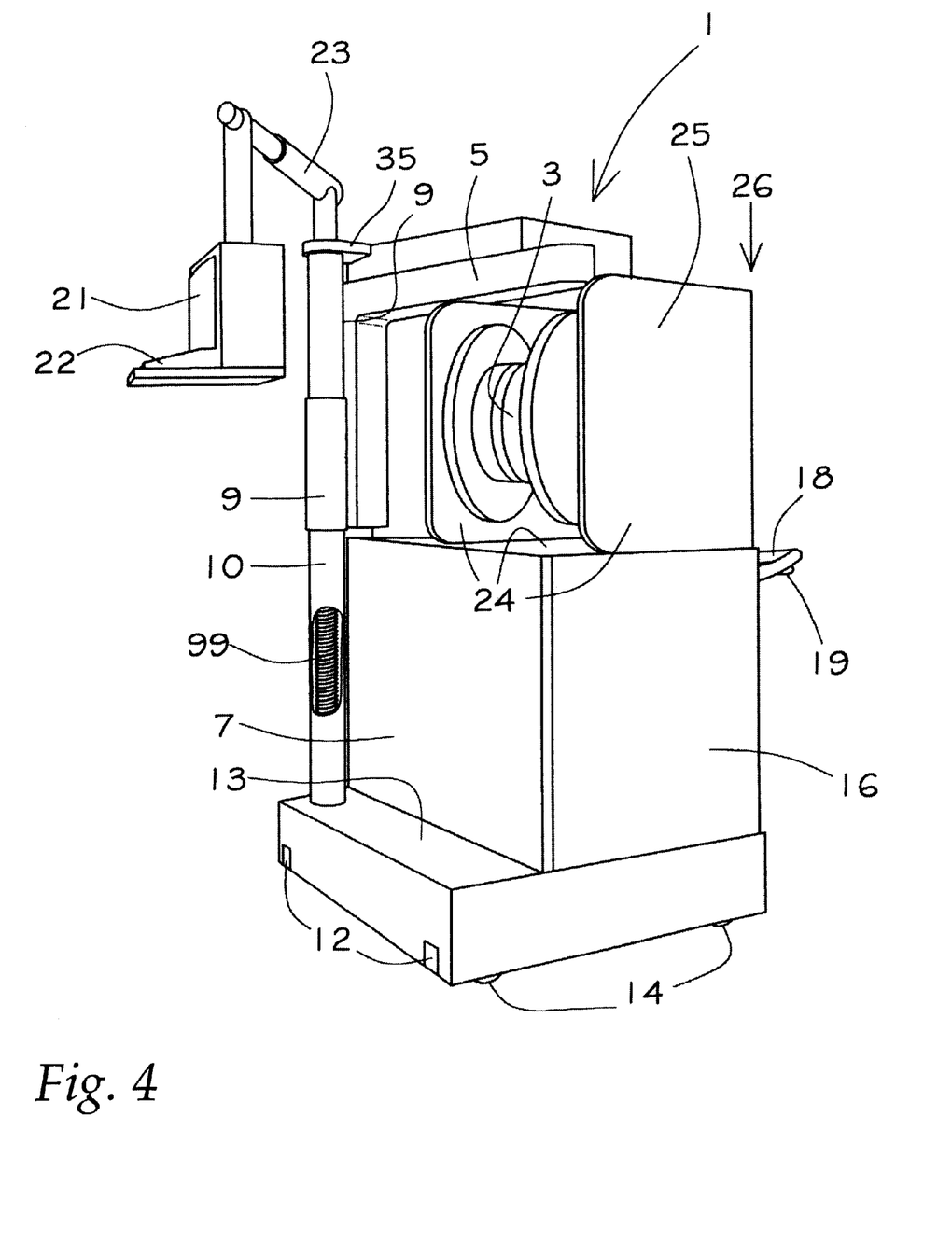
FIG. 4 illustrates a general isometric view of a transportable intraoperative magnetic resonance imaging apparatus, in accordance with a preferred embodiment of the present invention in its storing and transporting position.

FIG. 4 illustrates a general isometric view of a transportable intraoperative magnetic resonance imaging apparatus, in accordance with a preferred embodiment of the present Invention in its storing and transporting position.

Here the pair of magnets 3 is confined inside casing 24, made of ferromagnetic metal. Note that bars 12 are retracted and stored at the bottom of housing 7, as no support is required outside housing 7 when the magnets 3 are placed in their storing position, and thus the apparatus is rendered greater maneuverability. Note also that the monitor 21 and keyboard 22 are drawn closer to housing 7. This also is designed to render the apparatus greater maneuverability, and prevent accidental damage by bumping into obstacles as the apparatus is transported.

Note that in order to allow convenient insertion of magnets 3 the ferromagnetic casing 24 is provided with a door 25 pivotally rotatable about a hinge 26 allowing the door to be swung open or be closed. This way it allows magnets 3, which travel along an arc defined by the length of arm 5, to be placed inside the ferromagnetic casing 24 conveniently. Optionally door 25 is connected to hinge 26 by means of a torsion spring (not shown in the figure) which forces the door open. When magnets 3 are placed within casing 24 their magnetic force pulls door 25 to its closed position. The walls, and particularly the bottom wall of casing 24 are preferably made of steel plate at least 3 mm thick in order to protect the electronic components stored within housing 7 from the magnetic field of magnets 3, and provide effective magnetic shielding (see FIG. 2). Casing 24 is preferably not provided with a top wall in order to allow arm 5 with magnets 3 suspended on it to be brought to the storing position conveniently. Optionally a removable cover may be provided to casing 24 in order to prevent erroneous placing of objects (especially objects in the risk of being Influenced or damaged by a strong magnetic field) in the vicinity of the pair of magnets when stored inside casing 24.

It is important to employ RF shielding means to prevent background or noise signals from interfering with the operation of MRI systems, as the magnetic resonance signal is weak, and noise or background signals may interfere with the signal and consequently damage the reconstructed image.

In the conventional large whole body imaging systems, the MRI system is located in a large facility whose walls are adapted to provide RF shielding. This is achieved by adding metal fortification to the walls, either in the form of large metal plates or metal rods arranged in a grid.

The apparatus of the present invention may be operated in a room adapted to provide RF shielding, but this might limit the options for operating locations or even annul them. It is therefore suggested that the apparatus of the present invention be provided with a portable deployable RF cage. The RF shielding optionally has filter interface which filters undesired signals from the front end from interfering with the performance of the back end.

Figure 5:
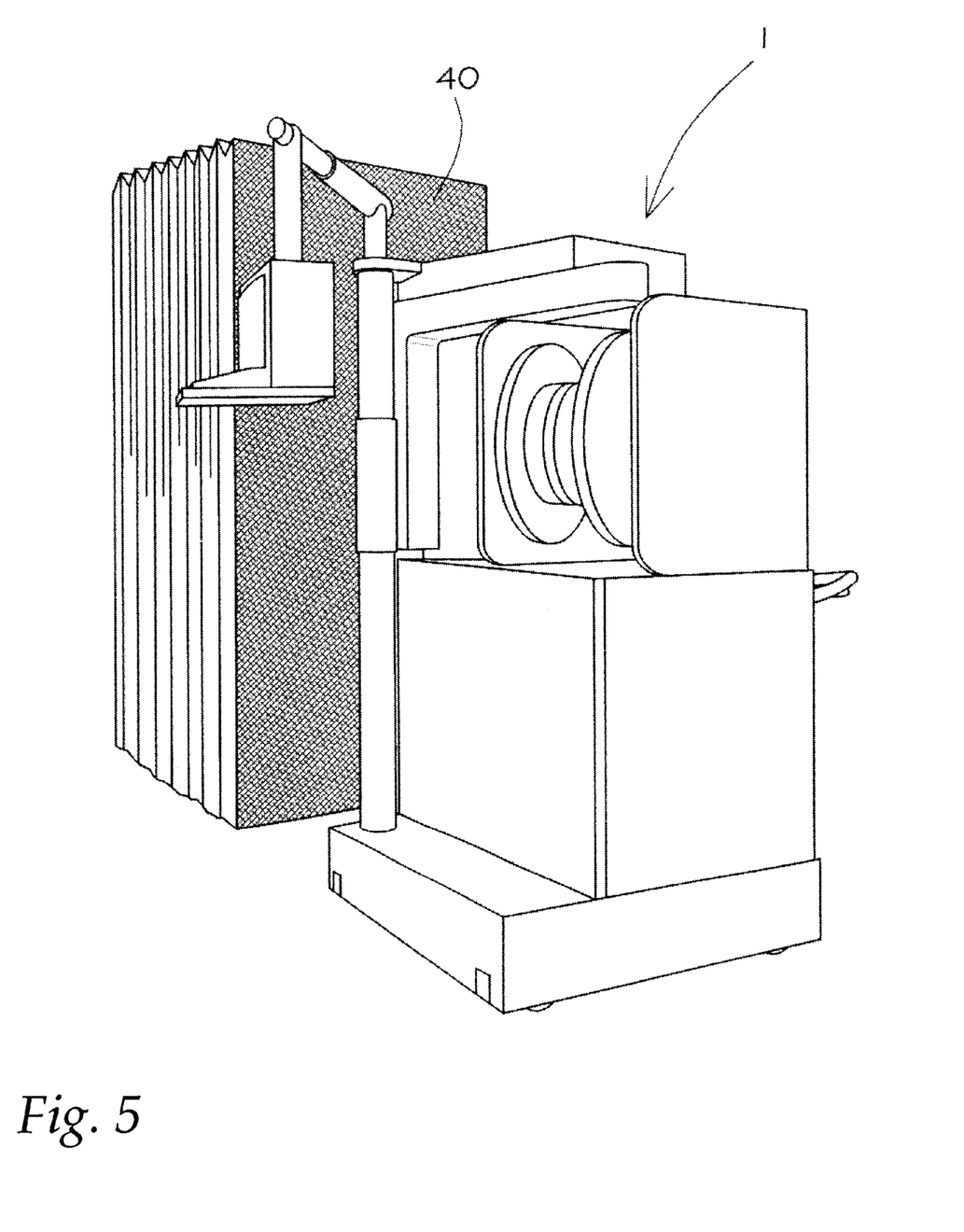
FIG. 5 illustrates a general isometric view of a transportable intraoperative magnetic resonance imaging apparatus, in accordance with a preferred embodiment of the present invention in its storing and transporting position with a portable deployable RF (radio frequency) cage in its stored state.

FIG. 5 illustrates a general isometric view of a transportable intraoperative magnetic resonance imaging apparatus 1, in accordance with a preferred embodiment of the present Invention In its storing and transporting position with a portable deployable RF (radio frequency) cage 40 in its stored state. The portable deployable RF cage 40 is put aside when not in use. Optionally the portable deployable RF cage detached from the main apparatus, but it may also be attached to it and be transported as one unit.

Figure 6:
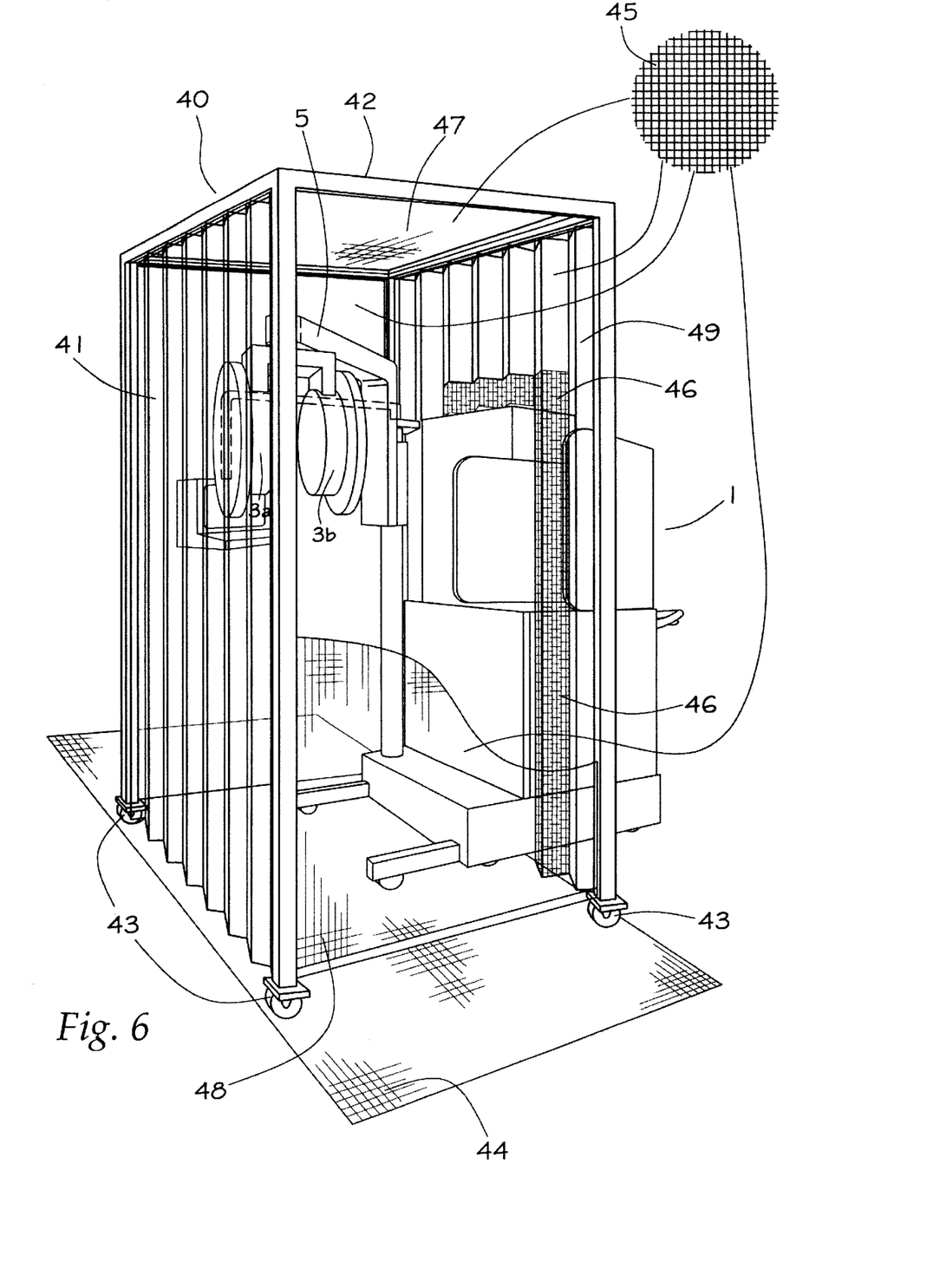
FIG. 6 illustrates a general isometric view of a transportable intraoperative magnetic resonance imaging apparatus, in accordance with a preferred embodiment of the present invention in its operative imaging position, with the portable deployable RF cage deployed over the apparatus.

FIG. 6 illustrates a general isometric view of a transportable intraoperative magnetic resonance imaging apparatus 1 in accordance with a preferred embodiment of the present invention in its operative imaging position, with the portable deployable RF cage 40 deployed over the apparatus. The portable deployable RF cage 40 consists of a rigid construction frame 42, preferably made of stainless steel, provided with wheels 43, and having two opposing side walls 48, and two opposite foldable deployable walls—front wall 41 and back wall 49, and a top foldable deployable wall 47. The walls comprise a copper mesh (see enlarged portion 45 depicting the mesh), and are mounted over the rigid construction frame 42. When deployed the RF cage 40 substantially covers the patient's bed (itself made of non-ferrous materials) and the magnets which are positioned in the imaging position over the patient's body part to be imaged. The back wall 49 is shorter than the front wall 41, as it extends towards the top of the apparatus 1. In order to prevent outside stray signals from Infiltrating the cage at the seams, RFI gasket 46 is provided along the joining lines of the cage and the apparatus. In order to prevent RF signal from entering the cage from underneath, a hard aluminum sheet is placed underneath the cage, prior to the deployment of the cage and throughout the imaging procedure.

The present invention is in no way limited to any particular magnet assembly, nor is it limited to any particular MRI component construction or design. The magnets used in a transportable magnetic resonance imaging apparatus in accordance with the present invention are preferably in the range of 0.1–0.6 Tesla.

It should be clear that the description of the embodiments and attached Figures set forth in this specification serves only for a better understanding of the invention, without limiting its scope as covered by the following claims.

It should also be clear that a person in the art, after reading the present specification could make adjustments or amendments to the attached Figures and above described embodiments that would still be covered by the following claims.

What is claimed is:

1. A transportable magnetic resonance imaging apparatus comprising:
   a transportable platform;
   a magnetic resonance imaging system mounted onto said transportable platform, said magnetic resonance imaging system including a magnetic structure having a pair of spaced apart magnets bounding an imaging volume of sufficient shape and size to accommodate a patient's body part for imaging;
   a host computer mounted on the transportable platform and coupled to the magnetic structure so as to process and display a magnetic resonance image;
   a magnetic flux suppressor provided on the transportable platform; and
   a positioning assembly configured to move the magnetic structure between a first position in which the pair of spaced apart magnets are positioned within the magnetic flux suppressor so as to suppress the magnetic flux of the pair of spaced apart magnets, and a second position in which the pair of spaced apart magnets are deployed in an arrangement suitable for magnetic resonance imaging.

2. The apparatus of claim 1, wherein the pair of spaced apart magnets comprises a pair of permanent magnets.

3. The apparatus of claim 1, wherein the pair of spaced apart magnets have an annular shape.

4. The apparatus of claim 1, wherein the magnetic flux suppressor comprises a ferromagnetic metal casing.

5. The apparatus of claim 4, wherein the ferromagnetic metal casing comprises a door that is pivotally connected to a hinge, thereby allowing the door to be opened and closed.

6. The apparatus of claim 5, wherein the hinge is coupled to a torsion spring that forces the door open when the magnetic structure is in the second position, but allows the door to close when the magnetic structure is in the first position and exerts a magnetic force on the door.

7. The apparatus of claim 1, further comprising an arm connected to the transportable platform, and a shaft pivotally connected to the arm.

8. The apparatus of claim 7, wherein the shaft is connected to a U-shaped frame that includes a first arm and a second arm, each arm supporting one of the pair of spaced apart magnets.

9. The apparatus of claim 7, wherein the arm has the shape of an inverted-L and is connected to the transportable platform by a vertical column.

10. The apparatus of claim 9, wherein the inverted-L-shaped arm and the vertical column are connected by a slider block, which is pivotally coupled to the inverted-L-shaped arm and which is slidably and rotatably connected to the vertical column.

11. The apparatus of claim 10, wherein the vertical column comprises a rotatable lead screw having external threading to which the slider block is coupled, thereby facilitating raising and lowering of the slider block by rotating the rotatable lead screw.

12. The apparatus of claim 11, wherein a motor is coupled to the rotatable lead screw to facilitate its rotation.

13. The apparatus of claim 9, wherein the inverted-L-shaped arm is connected to the vertical column so that the inverted-L-shaped arm can be tilted at an angle θ relative to the vertical column.

14. The apparatus of claim 13, further comprising a worm wheel and a worm screw configured to cooperatively tilt the inverted-L-shaped arm relative to the vertical column.

15. The apparatus of claim 1, further comprising a U-shaped frame that includes a first arm and a second arm, each arm supporting one of the pair of spaced apart magnets.

16. The apparatus of claim 1, wherein each of the pair of spaced apart magnets has an outer, distal side and an inner, proximal side, and wherein a gradient coil is provided at the outer, distal side or at the inner, proximal side of each of the pair of spaced apart magnets.

17. The apparatus of claim 1, wherein the host computer comprises a monitor, which is configured to display the magnetic resonance image and which is attached to a telescopically extricable pole that is connected to the transportable platform.

18. The apparatus of claim 17, wherein the monitor is an LCD display monitor.

19. The apparatus of claim 17, wherein the telescopically extricable pole is connected to the transportable platform by a vertical column, about which the telescopically extricable pole is rotatable.

20. The apparatus of claim 1, further comprising wheels to allow the apparatus to be transferred between locations.

21. The apparatus of claim 20, further comprising a motor to provide the wheels with an automotive force.

22. The apparatus of claim 21, further comprising a handle to facilitate control over the apparatus during transfer between locations.

23. The apparatus of claim 21, further comprising a gear transmission and a differential drive to enhance maneuverability of the apparatus.

24. The apparatus of claim 1, further comprising at least two gradient amplifiers.

25. The apparatus of claim 1, further comprising RF shielding surrounding the magnetic structure to thereby shield the magnetic resonance imaging system from undesired signals that can interfere with the performance of the apparatus.

26. The apparatus of claim 25, wherein the RF shielding comprises a portable, deployable RF cage.

27. The apparatus of claim 26, wherein the portable, deployable RF cage comprises a copper mesh mounted over a rigid construction frame provided with wheels and including at least two opposing side walls, at least two opposing foldable, deployable walls, and a top foldable, deployable wall.

28. The apparatus of claim 26, further comprising an RFI gasket positioned along joining lines between the portable, deployable RF cage and a housing provided on the transportable platform.

29. The apparatus of claim 26, further comprising a hard aluminum sheet positioned at the bottom of the portable, deployable RF cage.

30. A transportable magnetic resonance imaging apparatus comprising:

a transportable platform;

a magnetic resonance imaging system mounted onto said transportable platform, said magnetic resonance imaging system including a magnetic structure having a pair of spaced apart magnets bounding an imaging volume of sufficient shape and size to accommodate a patient's body part for imaging;

a magnetic flux suppressor provided on the transportable platform; and a positioning assembly configured to move the magnetic structure between a first position in which the pair of spaced apart magnets are positioned within the magnetic flux suppressor so as to suppress the magnetic flux of the pair of spaced apart magnets, and a second position in which the pair of spaced apart magnets are deployed in an arrangement suitable for magnetic resonance imaging.

* * * * *